United States Patent
Lee et al.

(10) Patent No.: US 9,318,176 B2
(45) Date of Patent: Apr. 19, 2016

(54) SEMICONDUCTOR INTEGRATED CIRCUIT

(71) Applicant: SK hynix Inc., Gyeonggi-do (KR)

(72) Inventors: Sang Kyu Lee, Chungcheongbuk-do (KR); Wan Ik Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 161 days.

(21) Appl. No.: 14/085,564

(22) Filed: Nov. 20, 2013

(65) Prior Publication Data

US 2014/0376326 A1 Dec. 25, 2014

(30) Foreign Application Priority Data

Jun. 24, 2013 (KR) .................. 10-2013-0072412

(51) Int. Cl.
*G11C 8/00* (2006.01)
*G11C 8/18* (2006.01)

(52) U.S. Cl.
CPC .................................. *G11C 8/18* (2013.01)

(58) Field of Classification Search
CPC .......................................................... G11C 8/18
USPC ........................................... 365/233.14, 194
See application file for complete search history.

(56) References Cited

U.S. PATENT DOCUMENTS

| | | | | |
|---|---|---|---|---|
| 5,722,063 | A * | 2/1998 | Peterzell et al. | 455/287 |
| 6,088,290 | A * | 7/2000 | Ohtake et al. | 365/189.05 |
| 7,370,810 | B2 * | 5/2008 | Nara | 235/492 |
| 8,208,320 | B2 * | 6/2012 | Kanda | 365/191 |
| 8,351,237 | B2 * | 1/2013 | Takizawa | 365/145 |
| 8,456,937 | B2 * | 6/2013 | Ku | 365/222 |
| 8,582,382 | B2 * | 11/2013 | Oh | 365/221 |
| 8,755,246 | B2 * | 6/2014 | Kanda et al. | 365/230.06 |
| 8,825,939 | B2 * | 9/2014 | Oh et al. | 711/103 |
| 8,923,051 | B2 * | 12/2014 | Cho | 365/185.08 |
| 9,036,440 | B2 * | 5/2015 | Song | 365/222 |

FOREIGN PATENT DOCUMENTS

KR 1020080067903 7/2008

* cited by examiner

*Primary Examiner* — Viet Q Nguyen
(74) *Attorney, Agent, or Firm* — IP & T Group LLP

(57) ABSTRACT

A semiconductor integrated circuit includes a clock pulse generating circuit suitable for outputting a command enable clock pulse when a predetermined command is input during a predetermined command-masking period, a command interface circuit suitable for outputting an internal command signal based on the command enable clock pulse and the command, and a target operating circuit suitable for performing an operation corresponding to the command based on the internal command signal.

20 Claims, 3 Drawing Sheets

SEMICONDUCTOR INTEGRATED CIRCUIT

CROSS-REFERENCE TO RELATED APPLICATION

The present application claims priority of Korean patent application number 10-2013-0072412, filed on Jun. 24, 2013, the entire disclosure of which is incorporated herein by reference in its entirety.

BACKGROUND

1. Field of Invention

Exemplary embodiments of the present invention relate to a semiconductor integrated circuit, and more particularly, to a semiconductor integrated circuit for performing a reset operation.

2. Description of Related Art

Generally, in a memory device, when an input of data from the outside is completed, an input of a command is permitted after a fixed time, for example, 2 cycles of a clock signal, is elapsed. In a flash memory device, after data is input, the input of the command is prohibited while the data is transferred to a read/write circuit, for example, a page buffer. Hereinafter, such fixed time (or period) is referred to as a command-masking period. Thus, after completing the data input, a reset operation may not be performed for the command-masking period, and the reset operation may be permitted after the command-masking period elapses.

BRIEF SUMMARY

Various embodiments of the present invention directed to a semiconductor integrated circuit that may improve a response speed for a command signal.

A semiconductor integrated circuit according to an exemplary embodiment of the present invention includes a clock pulse generating circuit suitable for outputting a command enable clock pulse when a predetermined command is input during a predetermined command-masking period, a command interface circuit suitable for outputting an internal command signal based on the command enable clock pulse and the command, and a target operating circuit suitable for performing an operation corresponding to the command based on the internal command signal.

A semiconductor integrated circuit according to another exemplary embodiment of the present invention includes a clock pulse generating circuit suitable for generating a command enable clock pulse suitable for being activated after a predetermined command-masking period when data is input or output, a command interface circuit suitable for receiving a command based on the command enable clock pulse to output an internal command signal, and a target operation circuit suitable for performing an operation corresponding to the internal command signal, wherein the clock pulse generating circuit is suitable for forcibly adjusting the command enable clock pulse to be activated in the predetermined command-masking period when an application of a reset command is detected.

A semiconductor integrated circuit according to another exemplary embodiment of the present invention includes a delaying unit suitable for delaying a flag signal based on a clock signal, wherein the flag signal denotes that a data input or output operation is performed, a command detecting unit suitable for detecting an application of a reset command during a predetermined command-masking period, and adjusting a transition time point of the delayed flag signal based on the detected result to output a pulse enable signal, a pulse generating unit suitable for generating the command enable clock pulse based on the pulse enable signal, a command interface circuit suitable for receiving a command based on the command enable clock pulse to output an internal command signal, and a target operation circuit suitable for performing an operation corresponding to the internal command signal.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DESCRIPTION OF EMBODIMENTS

Figure 1:
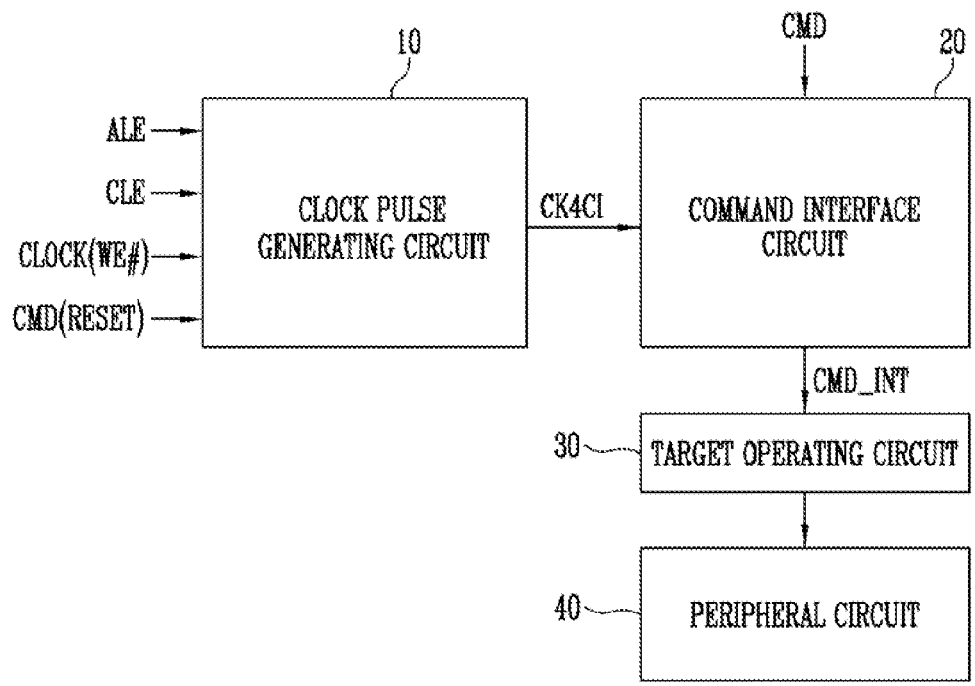
FIG. 1 is a block diagram illustrating a semiconductor integrated circuit according to an embodiment of the present invention.

The present invention will be described more fully hereinafter with reference to the accompanying drawings, in which exemplary embodiments of the invention are shown. This invention may, however, be embodied in different forms and should not be construed as limited to the embodiments set forth herein. The exemplary embodiments of the present invention are simply provided to perfect disclosure of the present invention and to fully enable those of ordinary skill in the art to embody and practice the invention. The scope of the present invention should be understood from the appended claims. Throughout the disclosure, reference numerals correspond directly to the like numbered parts in the various figures and embodiments of the present invention. In addition, a singular form may include a plural form as long as it is not specifically mentioned in a sentence.

FIG. 1 is a block diagram illustrating a semiconductor integrated circuit according to an embodiment of the present invention.

Referring to FIG. 1, the semiconductor integrated circuit includes a clock pulse generating circuit 10, a command interface circuit 20 and a target operating circuit 30. The clock pulse generating circuit 10 activates a command enable clock pulse CK4CI when a predetermined command is input during a command-masking period. Here, the predetermined command CMD may be a reset command RESET. The command interface circuit 20 receives the command CMD to generate an internal command signal CMD_INT based on the command enable clock pulse CK4CI. The target operating circuit 30 performs a target operation corresponding to the command CMD based on the internal command signal CMD_INT. When the reset command RESET is input to the clock pulse generating circuit 10 during the command-masking period, the target operating circuit 30 may reset a peripheral circuit 40 based on the internal command signal CMD_INT of the command interface circuit 20 operated according to the command enable clock pulse CK4CI.

During a data input operation, the command-masking period may correspond to 2 cycles of a clock signal, for example, a write enable signal WE#, starting from completion of the data input. In addition, during an operation of data output, the command-masking period may correspond to one cycle of the clock signal, for example, the write enable signal WE#, after the data is latched to the peripheral circuit 40 and before the data is output to the outside. For example, during the data input operation, both an address latch enable signal ALE (or a flag signal denoting that a data input/output operation is performed) and a command latch enable signal CLE are in active states (e.g., logic high states), and during the command-masking period, the address latch enable signal ALE and the command latch enable signal CLE may be input to the clock pulse generating circuit 10 in inactive states. A detailed description of the command-masking period will be given later.

Figure 2:
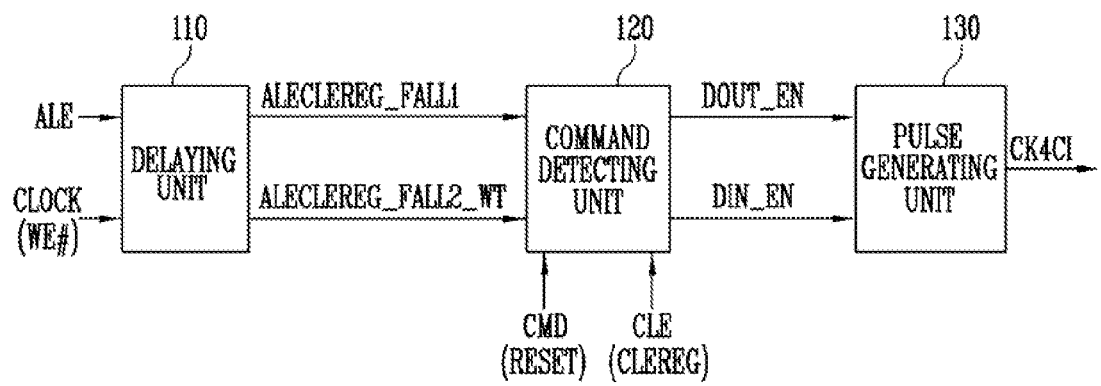
FIG. 2 is a detailed diagram illustrating a clock pulse generating circuit shown in FIG. 1.
Figure 3:
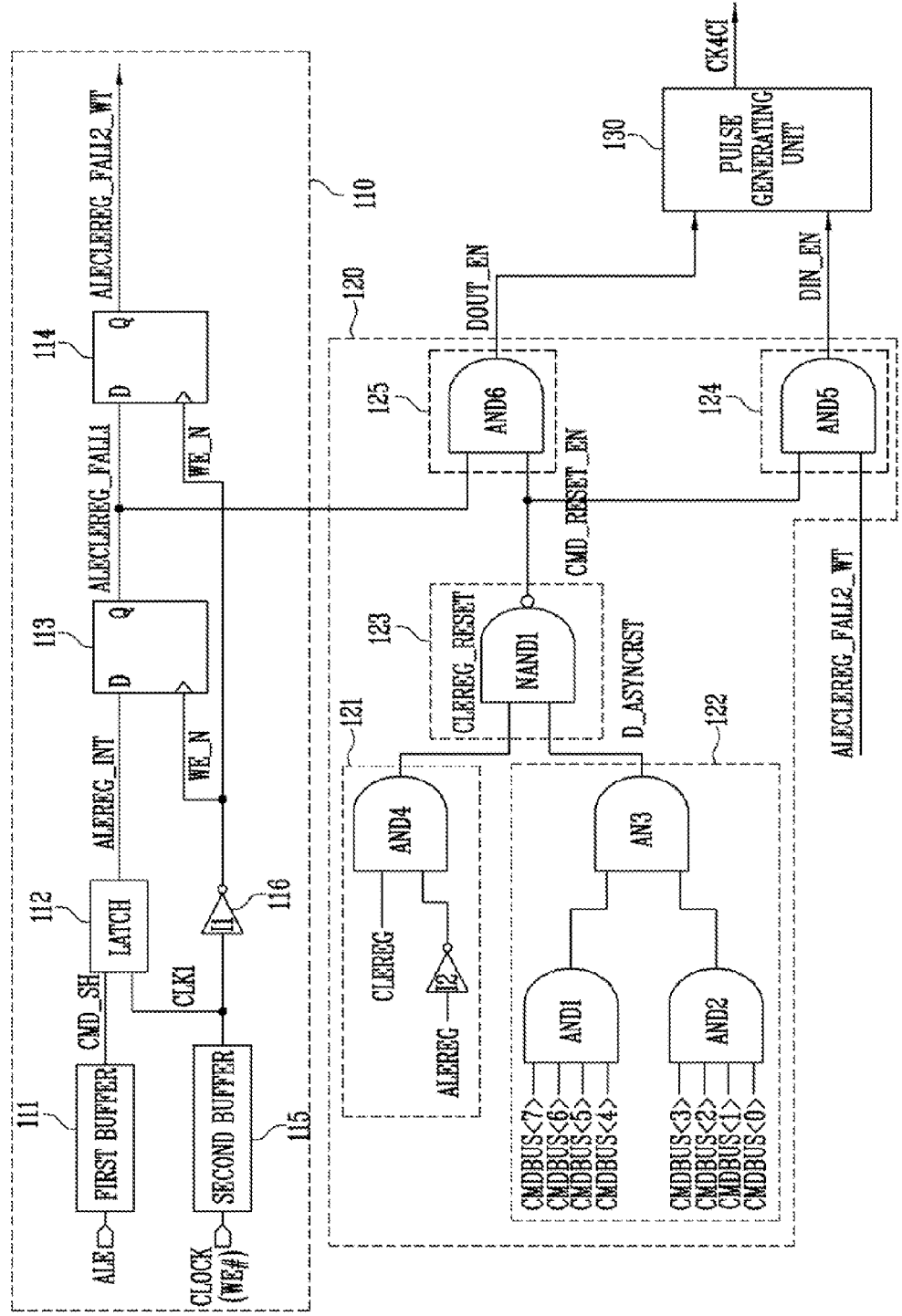
FIG. 3 is a detailed diagram illustrating a delaying unit and a command detecting unit shown in FIG. 1.

FIGS. 2 and 3 are detailed diagrams illustrating the clock pulse generating circuit shown in FIG. 1.

Referring to FIGS. 2 and 3, the clock pulse generating circuit 10 determines whether the command CMD is input during the command-masking period based on the address latch enable signal ALE and the command latch enable signal CLE. When the command CMD is input while the input of the command CMD is blocked by the address latch enable signal ALE and the command latch enable signal CLE, the clock pulse generating circuit 10 outputs the command enable clock pulse CK4CI in an activated state.

The clock pulse generating circuit 10 may include a delaying unit 110, a command detecting unit 120 and a pulse generating unit 130.

The delaying unit 110 outputs a first delay signal ALECLEREG_FALL2_WT having a first delay time compared to the address latch enable signal ALE based on a clock signal, for example, a write enable signal WE#. The delaying unit 110 may further output a second delay signal ALECLEREG_FALL1 having a second delay time shorter than the first delay time compared to the address latch enable signal ALE based on the write enable signal WE#. The delaying unit 110 may synchronize the first delay signal ALECLEREG_FALL2_WT and the second delay signal ALECLEREG_FALL1 with the write enable signal WE#. That is, the delaying unit 110 may delay the address latch enable signal ALE for 2 cycles of the write enable signal WE# to output the first delay signal ALECLEREG_FALL2_WT. In addition, the delaying unit 110 may delay the address latch enable signal ALE for one cycle of the write enable signal WE# to output the second delay signal ALECLEREG_FALL1.

The address latch enable signal ALE is input to a first buffer 111, and an output signal CMD_SH output from the first buffer 111 is input to a latch 112. A signal ALEREG_INT output from the latch 112 is input to a first flip-flop 113.

The write enable signal WE# is input to a second buffer 115, a signal CLK1 output from the second buffer 115 may be used as an enable signal of the latch 112. In addition, the signal CLK1 is input to an inverter I1, and a signal WE_N inverted by the inverter I1 may be used as a clock input of the first flip-flop 113.

The first flip-flop 113 outputs the second delay signal ALECLEREG_FALL1. The output signal of the first flip-flop 113 is input to a second flip-flop 114, and the output signal WE_N of the inverter I1 may be used as a clock input of the second flip-flop 114. The second flip-flop 114 outputs the first delay signal ALECLEREG_FALL2_WT.

As described above, the first delay signal ALECLEREG_FALL2_WT and the second delay signal ALECLEREG_FALL1 are generated by delaying the address latch enable signal ALE, but an activation time point is determined by the write enable signal WE#. That is, delay signals ALECLEREG_FALL2_WT and ALECLEREG_FALL1 are synchronized with the write enable signal WE#. Here, the first delay signal ALECLEREG_FALL2_WT is output through two flip-flops 113 and 114, thereby being delayed for 2 cycles of the write enable signal WE# compared to the address latch enable signal ALE. The second delay signal ALECLEREG_FALL1 is output through the one flip-flop 113, and thus is delayed for one cycle of the write enable signal WE# compared to the address latch enable signal ALE.

During the data input operation, the command-masking period is determined by the first delay signal ALECLEREG_FALL2_WT, and thus the command-masking period may correspond to 2 cycles of the write enable signal WE#, starting from completion of the data input. During the data output operation, the command-masking period is determined by the second delay signal ALECLEREG_FALL1, and thus the command-masking period during the data output may correspond to one cycle of the write enable signal WE# after the data is latched to the peripheral circuit 40 and before the data is output to the outside.

The command detecting unit 120 outputs a first pulse enable signal DIN_EN when an input of the reset command RESET is detected during the command-masking period. The first pulse enable signal DIN_EN may be activated when the command CMD is input during the command-masking period following completion of the data input. In addition, the command detecting unit 120 may activate a second pulse enable signal DOUT_EN when the input of the command CMD is detected during the command-masking period. The second pulse enable signal DOUT_EN may be activated when the reset command CMD is input during the command-masking period after the data is latched to the peripheral circuit 40 and before the data is output.

The command detecting unit 120 may include first to fifth logic sections 121 to 125.

The first logic section 121 outputs a command detection signal CLEREG_RESET for checking (or detecting) the input of the command signal CMD based on an address latch enable signal ALEREG and a command latch enable signal CLEREG. The address latch enable signal ALEREG and the command latch enable signal CLEREG are output from respective registers (not shown) to which the address latch enable signal ALE and the command latch enable signal CLE are input. The first logic section 121 may include an inverter I2 to which the address latch enable signal ALEREG is input and an AND logic element AND4 to which an output signal of the inverter I2 and the command latch enable signal CLEREG are input.

The second logic section 122 detects the input of the command and outputs a detection signal D_ASYNCRST. The second logic section 122 may include AND logic elements AND1 and AND2 to which command bus signals CMD-BUS<0:7>, which are related to the reset command RESET, are input and an AND logic element AND3 to which output signals of the logic elements AND1 and AND2 are input.

The third logic section 123 combines the detection signals CLEREG_RESET and D_ASYNCRST. The third logic section may include a NAND logic element NAND1 to which the detection signals CLEREG_RESET and D_ASYNCRST are input to output a reset command detection signal CMD_RESET_EN.

The fourth logic section 124 combines the reset command detection signal CMD_RESET_EN and the first delay signal ALECLEREG_FALL2_WT, and outputs the first pulse enable signal DIN_EN. The fourth logic section 124 may include an AND logic element AND5 to which the reset command detection signal CMD_RESET_EN and the first delay signal ALECLEREG_FALL2_WT are input.

The fifth logic section 125 combines the reset command detection signal CMD_RESET_EN and the second delay signal ALECLEREG_FALL1, and outputs the second pulse enable signal DOUT_EN. The fifth logic section 125 may include an AND logic element AND6 to which the reset command detection signal CMD_RESET_EN and the second delay signal ALECLEREG_FALL1 are input.

That is, the third to fifth logic sections 123 to 125 may generate the first pulse enable signal DIN_EN and the second pulse enable signal DOUT_EN based on the detection signals CLEREG_RESET and D_ASYNCRST and the delay signals ALECLEREG_FALL2_WT and ALECLEREG_FALL1.

The pulse generating unit 130 outputs the command enable clock pulse CK4CI based on the first pulse enable signal DIN_EN. In addition, the pulse generating unit 130 may output the command enable clock pulse CK4CI based on the second pulse enable signal DOUT_EN.

When the reset command RESET is input as the command CMD during the command-masking period by the circuits described above, the target operating circuit 30 and/or the peripheral circuit 40 may be reset.

Figure 4:
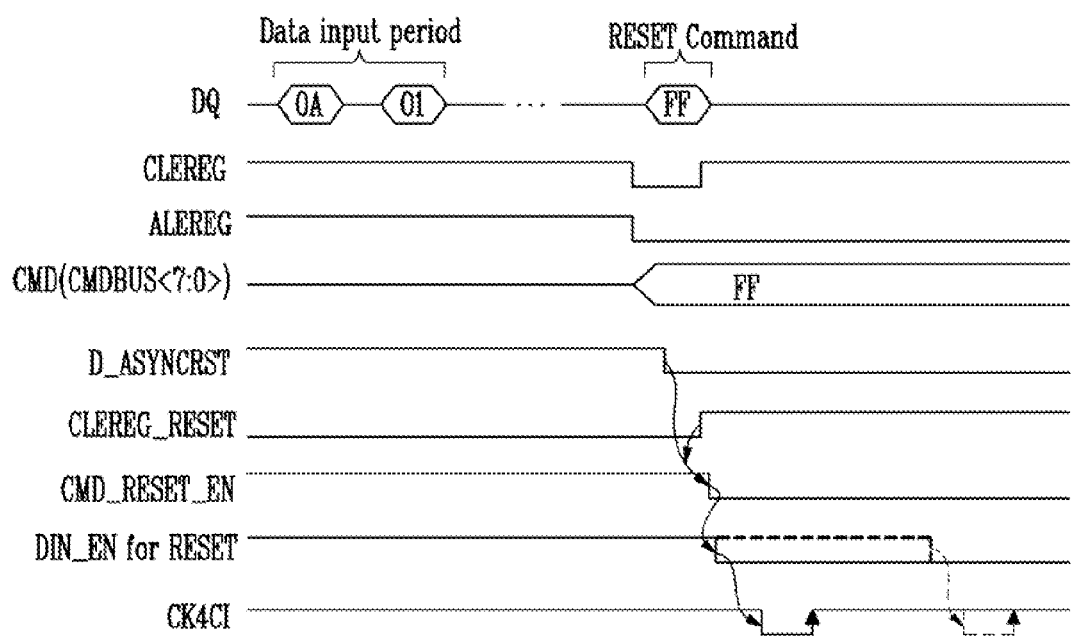
FIG. 4 is a waveform diagram illustrating an operation of the semiconductor integrated circuit shown in FIG. 3.

FIG. 4 is a waveform diagram illustrating an operation of the semiconductor integrated circuit shown in FIG. 3.

Referring to FIGS. 3 and 4, in a data input period, both of the command latch enable signal CLEREG and the address latch enable signal ALEREG are in active states (e.g., logic high states). Next, when the data input is completed, both of the command latch enable signal CLEREG and the address latch enable signal ALEREG are in inactive states (e.g., logic low levels).

At this time, even if the command CMD is input, the command enable clock pulse CK4CI for the input of the command CMD may be activated when a state of the first pulse enable signal DIN_EN is changed (or activated). If there is no command detecting unit 120 (or when a general command excluding the reset command RESET is input), the state (refer to dotted line) of the first pulse enable signal DIN_EN is not changed for 2 cycles of the write enable signal WE#, and thus the command enable clock pulse CK4CI may not be activated immediately (refer to dotted line). That is, even if the reset command RESET is input immediately after completion of the data input, the command enable clock pulse CK4CI may be activated after 2 cycles of the write enable signal WE#, elapses, and thus the input of the command CMD to a circuit inside is delayed for 2 cycles.

However, in the present exemplary embodiment, the command detecting unit 120 may forcibly change the state of the first pulse enable signal DIN_EN when an application of the reset command RESET is detected. That is, when the reset command RESET is input, the command-masking period may be disregarded, and thus the reset command RESET may not be blocked even in the command-masking period.

After completion of the data input, the command CMD is input in a state in which the command latch enable signal CLEREG and the address latch enable signal ALEREG are changed to the inactive states (for example, logic low level). When the command CMD is input, the command latch enable signal CLEREG becomes the active state (for example, logic high level. The first logic section 121 outputs the command detection signal CLEREG_RESET denoting the presence of the command CMD input in the active state (for example, logic high level) based on the command latch enable signal CLEREG and the address latch enable signal ALEREG. At this time, the second logic section 122 outputs the detection signal D_ASYNCRST denoting the input of the reset command RESET in the active state (for example, logic high level) based on the command bus signals CMDBUS<0> to CMDBUS<7>. For example, when the reset command RESET is input, all of the command bus signals CMDBUS<0> to CMDBUS<7> are in the logic high states.

The command detecting unit 120 may forcibly change the state (refer to a line) of the first pulse enable signal DIN_EN from the logic high level to the logic low level based on the reset command detection signal CMD_RESET_EN and the first delay signal ALECLEREG_FALL2_WT. The pulse generating unit 130 activates the command enable clock pulse CK4CI based on the first pulse enable signal DIN_EN whose state is forcibly changed. Thus, after completion of the data input, the command may be received before 2 cycles of the write enable signal WE# elapses.

Meanwhile, although not shown in drawings, during the data output operation, the command detecting unit 120 may forcibly change the state of the second pulse enable signal DOUT_EN from the logic high level to the logic low level based on the reset command detection signal CMD_RESET_EN and the second delay signal ALECLEREG_FALL1. The pulse generating unit 130 activates the command enable clock pulse CK4CI based on the second pulse enable signal DOUT_EN whose state is forcibly changed. Thus, after completion of the data input, the command CMD may be received before one cycle of the write enable signal WE# elapses.

The command interface circuit 20 receives the command CMD and generates the internal command signal based on the command enable clock pulse CK4CI, and thus the target operating circuit 30 and/or the peripheral circuit 40 may be reset immediately. That is, when the reset command RESET is input during the command-masking period (or a command input prohibition period), a reset operation may be performed without delay.

In accordance with the embodiment of the present invention, in an integrated circuit, for example, a flash memory device, a response speed for a reset command may be improved.

In the drawings and specification, typical exemplary embodiments of the invention are disclosed, and although specific terms are employed, they are used in a generic and descriptive sense only and not for purposes of limitation. It will be understood by those of ordinary skill in the art that various changes in form and details may be made to the exemplary embodiments without departing from the spirit and scope of the present invention as defined by the following claims.

What is claimed is:

1. A semiconductor integrated circuit, comprising:
   a clock pulse generating circuit suitable for outputting a command enable clock pulse when a predetermined command is input during a predetermined command-masking period;
   a command interface circuit suitable for outputting an internal command signal based on the command enable clock pulse and the command; and
   a target operating circuit suitable for performing an operation corresponding to the command based on the internal command signal.

2. The semiconductor integrated circuit of claim 1, wherein the predetermined command includes a reset command.

3. The semiconductor integrated circuit of claim 2, wherein the clock pulse generating circuit is suitable for determining whether the reset command is input during the predetermined command-masking period based on an address latch enable signal and a command latch enable signal.

4. The semiconductor integrated circuit of claim 3,
wherein the clock pulse generating circuit activates the command enable clock pulse when the reset command is input in the predetermined command-masking period.

5. The semiconductor integrated circuit of claim 2,
wherein the predetermined command-masking period corresponds to 2 cycles of a clock signal from completion of data input.

6. The semiconductor integrated circuit of claim 2,
wherein the clock pulse generating circuit comprises:
a delaying unit suitable for outputting a first delay signal having a first delay time compared to an address latch enable signal based on a clock signal;
a command detecting unit suitable for activating a first pulse enable signal when an input of the reset command is detected during the predetermined command-masking period; and
a pulse generating unit suitable for generating the command enable clock pulse based on the first pulse enable signal.

7. The semiconductor integrated circuit of claim 6,
wherein the delaying unit is suitable for synchronizing the first delay signal with a write enable signal as the clock signal.

8. The semiconductor integrated circuit of claim 7,
wherein the delaying unit is suitable for delaying the address latch enable signal for 2 cycles of the write enable signal to output the first delay signal.

9. The semiconductor integrated circuit of claim 6,
wherein the command detecting unit comprises:
a first logic section suitable for checking an input of a command signal based on the address latch enable signal and a command latch enable signal;
a second logic section suitable for checking the input of the reset command;
a third logic section suitable for outputting the reset command detection signal based on output signals of the first and second logic sections; and
a fourth logic section suitable for outputting the first pulse enable signal based on the reset command detection signal and the first delay signal.

10. The semiconductor integrated circuit of claim 9,
wherein the delaying unit is suitable for further outputting a second delay signal having a second delay time shorter than the first delay time compared to the address latch enable signal based on the clock signal.

11. The semiconductor integrated circuit of claim 10,
wherein the command detecting unit further comprising a fifth logic section suitable for outputting a second pulse enable signal based on the reset command detection signal and the second delay signal.

12. The semiconductor integrated circuit of claim 11,
wherein the pulse generating unit is suitable for outputting the command enable clock pulse based on the first pulse enable signal and the second pulse enable signal.

13. The semiconductor integrated circuit of claim 10,
wherein the delaying unit is suitable for synchronizing the second delay signal with a write enable signal as the clock signal.

14. The semiconductor integrated circuit of claim 13,
wherein the delaying unit is suitable for delaying the address latch enable signal for one cycle of the write enable signal to output the second delay signal.

15. The semiconductor integrated circuit of claim 3,
wherein the address latch enable signal and the command latch enable signal are input to the clock pulse generating circuit in inactive states during the predetermined command-masking period.

16. A semiconductor integrated circuit, comprising:
a clock pulse generating circuit suitable for generating a command enable clock pulse suitable for being activated after a predetermined command-masking period when data is input or output;
a command interface circuit suitable for receiving a command based on the command enable clock pulse to output an internal command signal; and
a target operation circuit suitable for performing an operation corresponding to the internal command signal,
wherein the clock pulse generating circuit is suitable for forcibly adjusting the command enable clock pulse to be activated in the predetermined command-masking period when an application of a reset command is detected.

17. The semiconductor integrated circuit of claim 16,
wherein the predetermined command-masking period is defined by a predetermined clock cycle of a write enable signal.

18. The semiconductor integrated circuit of claim 16,
wherein, when the data is input or output, an address latch enable signal is activated.

19. A semiconductor integrated circuit, comprising:
a delaying unit suitable for delaying a flag signal based on a clock signal, wherein the flag signal denotes that a data input or output operation is performed;
a command detecting unit suitable for detecting an application of a reset command during a predetermined command-masking period, and adjusting a transition time point of the delayed flag signal based on the detected result to output a pulse enable signal;
a pulse generating unit suitable for generating a command enable clock pulse based on the pulse enable signal;
a command interface circuit suitable for receiving a command based on the command enable clock pulse to output an internal command signal; and
a target operation circuit suitable for performing an operation corresponding to the internal command signal.

20. The semiconductor integrated circuit of claim 19,
wherein the command detecting unit comprises:
a first logic section suitable for detecting an input of a command signal based on an address latch enable signal and a command latch enable signal;
a second logic section suitable for detecting an input of the reset command based on command bus signals;
a third logic section suitable for outputting the reset command detection signal based on output signals of the first and second logic sections; and
a fourth logic section suitable for outputting the first pulse enable signal based on the reset command detection signal and the delayed flag signal.

* * * * *